United States Patent [19]

Sugimoto et al.

[11] 4,429,397
[45] Jan. 31, 1984

[54] BURIED HETEROSTRUCTURE LASER DIODE

[75] Inventors: Mitsunori Sugimoto; Hidenori Nomura, both of Tokyo, Japan

[73] Assignee: Nippon Electric Co., Ltd., Tokyo, Japan

[21] Appl. No.: 277,508

[22] Filed: Jun. 26, 1981

[30] Foreign Application Priority Data

Jun. 26, 1980 [JP] Japan .................................. 55-87042
Jun. 26, 1980 [JP] Japan .................................. 55-87047
Jun. 26, 1980 [JP] Japan .................................. 55-87049
Jun. 26, 1980 [JP] Japan .................................. 55-87050

[51] Int. Cl.³ ............................................ H01S 3/19
[52] U.S. Cl. ......................................... 372/46; 357/17
[58] Field of Search ...................... 372/45, 46, 43, 44; 357/17

[56] References Cited

U.S. PATENT DOCUMENTS 4,166,253 8/1979 Small et al. ............................ 372/46

*Primary Examiner*—James W. Davie
*Attorney, Agent, or Firm*—Sughrue, Mion, Zinn, Macpeak and Seas

[57] ABSTRACT

According to the present invention, an active semiconductor layer is provided on a mesa top of a semiconductor substrate having a strip-shaped mesa structure. A first clad layer is provided on the surface of the active layer and on the sides of the mesa to burry the top active region. Thereafter a pair of current blocking layers are provided on the first clad layer except for the top surface portion of the mesa stripe and a second clad layer is provided on the current blocking layers and the exposed first clad layer.

12 Claims, 9 Drawing Figures

BURIED HETEROSTRUCTURE LASER DIODE

BACKGROUND OF THE INVENTION

1. Field of the Invention

The present invention relates to a semiconductor laser diode and a process for fabrication of the same, and more particularly to a buried heterostructure laser diode containing a current blocking layer and a process for fabrication of the same.

2. Description of the Prior Art

A buried-structure laser diode (BH-LD) attracted general attention because of its stability in oscillation modes and low oscillation thresholds accordingly vigorous research and development thereof is progressing throughout the world. The BH-LD having a InGaAsP-/InP DH (Double Hetero) structure is expected to operate as a favorable light source for an optical fiber communication system because its oscillation wavelengths correspond to a 1.2–1.7 μm band which is a low transmission loss band of quartz series optical fibers.

Normally, the BH-LD requires two different epitaxial growth steps The first LPE (Liquid Phase Epitaxy) step is for forming a DH structure and the second LPE step forms a buried structure. Despite its excellent characteristics, however, such a BH-LD is not desirable because its fabrication yield is lowered due to the addition of an etching step for a DH structure wafer and a LPE step for burying. In addition, the degradation of reliability and operation characteristics caused by placing a DH structure wafer including a partly exposed active region under a high-temperature condition during the LPE step for burying, is a problem which must be further investigated.

Heretofore, K. Kishino et al discovered that a BH-LD having a InGaAsP/InP DH structure can be realized through a single LPE step. The Kishino et al. invention is referred to as a "Mesa Substrate Buried Heterostructure Diode (MSB-LD)," and the results of trial fabrication is reported in IEEE JOURNAL OF QUANTUM ELECTRONICS, VOL. QE-16, No. 2, FEBRUARY 1980, pages 160–164.

The MSB-LD was expected to improve reliability by eliminating the step of subjecting an exposed active region to a high temperature and to enhance a yield and lower cost by greatly shortening the process. However, since it was difficult to effectively form current confinining means, a sufficiently low oscillation threshold could not be obtained, and the realized oscillation threshold was as high as about 100 mA. More particularly, Kishino et al discovered that in a MSB-LD, if the cross-sectional configuration of the mesa stripe formed on the substrate, that is the height of the mesa and the slope angle of the mesa side face were appropriately selected, an InGaAsP layer could be grown on top of the mesa stripe separately from that of the mesa bottom. However, according to the propsed process, although an active region of 4–5 μm or more in width can be repeatedly obtained, it was difficult to form an active, region having a width of about 2 μm i.e., an active region favorable for stabilizing an oscillation mode and realizing a low oscillation threshold.

SUMMARY OF THE INVENTION

It is therefore one object of the present invention to provide a buried heterostructure laser diode containing current confining means i.e., a laser diode which effectively lowers the oscillation threshold.

Another object of the present invention is to provide a process for fabrication of a buried heterostructure laser diode which can stablize an oscillation mode and realize a low oscillation threshold, and also which can be fabricated through a single LPE step.

According to the present invention, an active semiconductor layer is provided on a mesa top of a semiconductor substrate having a stripe-shaped mesa structure. A first clad layer is provided on the surface of the active layer and on the sides of the mesa to burry the top active region. Thereafter, a pair of current blocking layers are provided on the first clad layer except for the top surface portion of the mesa stripe and a second clad layer is provided on the current blocking layers and the exposed first clad layer.

According to another feature of the present invention, there is provided a process for fabricating a laser diode comprising the steps of forming a stripe-shaped protrusion on a substrate, epitaxially growing on the substrate in sequence an active layer including a top active region and a clad layer having a conductivity type opposite to the substrate, and thereafter forming a current blocking layer having the same conductivity type as the substrate only on the opposite sides of the stripe-shaped protrusion during an epitaxially growing process.

In the above-featured laser diode, if an InP substrate having a (100) oriented principal surface is selected as the semiconductor substrate and the stripe-shaped mesa is formed in the <011> crystal orientation, then the epitaxial growth of the top active region on the top of the stripe-shaped mesa structure as well as the epitaxial growth of the clad region are controlled in an extremely reproducible manner by the degree of supercooling of the growing selection rather than the cross-sectional configuration of the stripe-shaped mesa structure. Therefore, according to the present invention, a laser diode having an excellent temperature characteristic can be obtained with good reproducibility.

DESCRIPTION OF PREFERRED EMBODIMENTS

Figure 1:
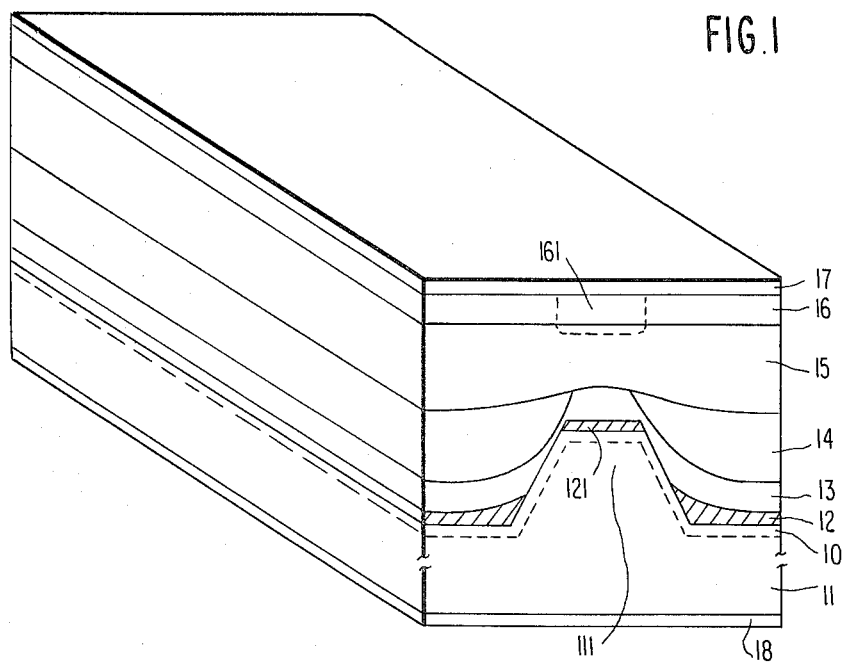
FIG. 1 is a perspective view showing one preferred embodiment of the present invention.

Referring now to FIG. 1, there is schematically shown a BH-LD according to one preferred embodiment of the present invention, which comprises a semiconductor substrate 11 having a stripe-shaped mesa structure 111, an active semiconductor layer 12 containing a top active region 121 epitaxially grown on the substrate 11, a first clad layer 13, a current blocking layer 14, a second clad layer 15, an electrode forming layer 16, a positive electrode 17 formed on the surface of the electrode forming layer 16, and a negative electrode 18 formed on the bottom surface of the substrate 11. The substrate 11 consists of an n-InP single crystal of about 70 μm in thickness having a (100) oriented principal surface, and the stripe-shaped mesa structure 111 has a width at the top of the mesa of 2 μm and a height of about 4 μm. The active layer 12 consists of an $In_{0.74}Ga_{0.26}As_{0.56}P_{0.44}$ layer of about 02 μm in thickness having an oscillation wavelength of 1.3 μm and a band gap of 0.95 eV. The first clad layer 13 consists of a p-InP layer having a band gap of 1.35eV, and a thickness at the flat portion of about 0.5 μm. The current blocking layer 14 consists of an n-InP layer having a thickness of 0.5-1 μm. This current blocking layer 14 may be replaced by a quaternary compound layer such as an $n-In_{0.81}Ga_{0.19}As_{0.42}P_{0.58}$ layer having band gap of 1.03 eV and a thickness of 3.5-4 μm. The second clad layer 15 is provided for the purpose of smoothening the top surface and it consists of a p-InP layer having a thickness of about 2-5 μm. The electrode forming layer, that is, cap layer 16 is provided for the purpose of facilitating ohmic contact with the positive electrode 17, and it consists of a $p-In_{0.74}Ga_{0.26}As_{0.56}P_{0.44}$ layer having a thickness of about 0.5 μm. The positive electrode 17 is made of Au-Zn alloy, the negative electrode 18 is made of Au-Sn alloy, and the length of the device in the axial direction of the resonator is about 200-300 μm.

In the above-described structure, upon operation, a current is blocked due to the just reversed polarity of the pn-junction formed at the boundary between the first clad layer 13 and the current blocking layer 14, and this contributes to efficient current injection to the top active region 121.

It is to be noted that the above structure could be modified in such a manner that the cap layer 16 is formed of an n-type layer, and a stripe-shaped diffused layer is formed as by Zinc (Zn) diffusion until it reaches the second clad layer 15 to convert the conductivity type of the cap layer 16 partly into p-type as shown by a dotted line 161 in FIG. 1. Moreover, as shown by a dotted line 10 in FIG. 1, a buffer layer of n-InP could be formed substantially uniformly on the mesa substrate.

In the above-described structure, in the case of a laser diode having an oscillation wavelength of 1.5 μm or longer, in order to prevent the top active region 121 from being subjected to melt-back upon growing the p-InP layer 13, it is desirable to provide an anti-meltback layer made of InGaAsP having an absorption edge wavelength λg of about 1.35 μm.

The current blocking layer 14 is made of n-InP or n-InGaAsP and it is formed on the opposite sides of the top active region 121 by selecting a condition for not growing above the mesa stripe. Since the pn-junction formed between the current blocking layer 24 and the first clad layer 13 of p-InP serves as barrier, current injection has almost no effect on the active layer 12 grown on the opposite sides of the bottom of the mesa stripe 111. Accordingly, efficient current injection to the top active region 121 at the top of the mesa stripe can be achieved.

A small leakage current through the p-InP clad layer may arise due to the fact that the top active region 121 is not contiguous to the current blocking layer 14. However, due to the effects of distributed resistance in the p-InP layer and the junction barrier potential differences at the InP-InGaAsP junction and the InP-InP junction the proportion of this leakage current relative to the current injected into the top active region 121 is at most, about several tens of a percent. Locating the current blocking layer 14 at a higher or lower level than the top active region 121 has little influence on the characteristics of the semiconductor laser.

Summarizing, the necessary conditions for fabricating the structure shown in FIG. 1 through a single LPE step, may be represented by the following two conditions, which appear, at a glance, to be inconsistent to each other in view of the technique for forming a layer:

(1) The active layer should be grown on the top of a narrow mesa stripe of 2-3 μm in width, in an isolated condition without being grown on the sloped side surface of the mesa.

(2) The current blocking layer should not be grown on the top of the mesa stripe but should be grown continuously in the regions on the opposite sides of the mesa stripe.

Now more detailed description will be made on the liquid phase growth on the mesa substrate. At first, results of investigation on the orientation of the mesa stripe will be discribed. It has been known that due to anisotropy of a semiconductor crystal, crystal growths on differently oriented surfaces are greatly different in the growing condition as well as growing speed. The mode of liquid phase growth was investigated with respect to a mesa substrate formed by employing a (100) oriented InP substrate and etching it with a hydrogen chloride (HCl) system etchant through a mesh of photoresist. The results are indicated in the following Table-1:

TABLE 1

Mesa Stripe Orientations versus Mode of Growth

| Method of Growth | Orientation of Mesa Stripe | Characteristic Mode of Growth |
|---|---|---|
| Two-Phase Solution Technique or Supercooling Technique | < 011 > | Grown even on the top of narrow mesa of 1-2 μm in width. Offset condition of growth appears on the mesa side surfaces. |
| | < 01$\bar{1}$ > | Growth suppressed on the top of narrow mesa of about 3-4 μm or less in width. Greatly grown in the directions of the mesa side surface. |

Note:
The substrate was an Sn-doped InP substrate having a (100) oriented surfaces; The grown layer was an InGaAsP layer (λg = 1.3 ~ 1.6 μm); and All the growths were made on a mesa stripe formed with an HCl system etchant.

As seen from Table-1, in the case of a <01$\bar{1}$> oriented mesa stripe, the growth is liable to be influenced by the cross-sectional configuration of the mesa stripe. Furthermore, as the width of the top of the mesa stripe is reduced, a trend of less growth on the top of the mesa stripe was observed. Whereas, in the case of a <011> oriented mesa stripe, the influence of the cross-sectional configuration of the mesa stripe is relatively small. It is possible to obtain growth on the top of a narrow mesa stripe of 1 μm or less in width.

Now, results of investigation on the growth on the top of a mesa stripe will be described. In order to form a laser diode structure having current confirming means as shown in FIG. 1 through a single LPE step, it is necessary to make a top active region grow on the top of a mesa stripe and to make a current blocking layer grow only in the portions excluding the top of the mesa stripe. If it is merely intended to make a top active region grow on the top of a mesa stripe, it is only necessary to extend the growing time to form a thick grown layer. However, in the case of a $<01\bar{1}>$ oriented mesa stripe, the structure for burying the top active region cannot be obtained, and so, it is difficult to obtain a laser diode having both an oscillation mode stability and a low oscillation threshold.

nique of InP, the growth on the top of the mesa stripe was not effected even for a width W≃4 μm. However, even in the case of growing InP, if the growth from a solution having a high degree of supercooling is employed, then sufficient growth on the top of the mesa stripe could be achieved even for a width W=0.5–1 μm.

Taking into consideration of the aforementioned results of investigation, trial fabrication of the structures shown in FIG. 1 for 1.3 μm band use and 1.5 μm band use was carried out by making use of an tin (Sn)-doped InP substrate having a (100) oriented principal surface. The trial fabrication was achieved according to the layer constructions and methods of growth as indicated in Table-2 below, selecting the design values of 3–4 μm in height of the mesa, and 0.1–0.2 μm in thickness and 1.5–2.5 μm in width of the top active region.

TABLE 2

Layer structures and Methods of Growth for Trial Fabrication

| Order | Grown Layers | Wavelength g (μm) | Growth Technique | Thickness at the Top of the Mesa (μm) | Thickness at the Flat Portion (μm) |
|---|---|---|---|---|---|
| (a) Laser Diode in FIG. 1 for 1.3 μm band use | | | | | |
| 1 | n-InP (Te) | ~0.92 | Supercooling | ~0.4 | ~0.4 |
| 2 | Active Layer | ~1.3 | Two-phase Solution | 0.1 ~ 0.2 | ~0.4 |
| 3 | p-InP (Zn) | ~0.92 | Supercooling | ~0.4 | ~0.4 |
| 4 | Current Blocking Layer | ~0.92 | Two-phase Solution | 0 | ~0.4 |
| 5 | p-InP (Zn) | ~0.92 | Two-phase Solution | ~2 | ~4 |
| 6 | Cap Layer | ~1.3 | Two-phase Solution | ~0.3 | ~0.8 |
| (b) Laser Diode in FIG. 1 for 1.5 μm band use | | | | | |
| 1 | n-InP (Te) | ~0.92 | Supercooling | ~0.4 | ~0.4 |
| 2 | Active Layer | ~1.58 | Two-phase Solution | 0.1 ~ 0.2 | ~0.4 |
| 3 | Anti-Melt-Back Layer | ~1.35 | Supercooling | ~0.2 | ~0.3 |
| 4 | p-Inp (Zn) | ~0.92 | Two-phase Solution | ~0.4 | ~0.4 |
| 5 | Current Blocking Layer | ~0.92 | Two-phase Solution | 0 | ~0.4 |
| 6 | p-InP (Zn) | ~0.92 | Supercooling | ~2 | ~4 |
| 7 | Cap Layer | ~1.3 | Two-phase Solution | ~0.3 | ~0.8 |

Figure 2:
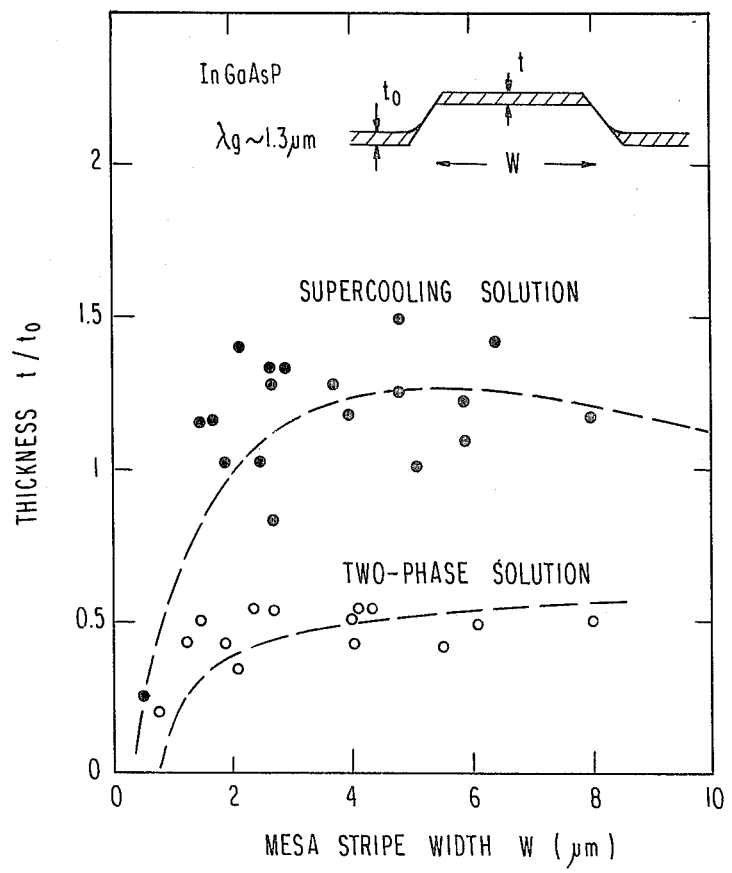
FIG. 2 is a diagram showing the relationship between a thickness of a layer grown on the top of a mesa stripe and a width of the top of the mesa stripe.

Investigations have been carried out, in connection with this invention, on the conditions for crystal growth on a mesa substrate having a <011> oriented mesa stripe, in which the crystal was grown up to a width W of the top of a narrow mesa stripe. The results of the investigations showed good reproducibility and burying configuration. Furthermore, it was discovered that crystal growth on the top of a mesa stripe can be controlled by taking the degree of supercooling of the growing solution as a parameter for control. FIG. 2 shows the results of growth of an InGaAsP layer having a composition corresponding to absorption edge wavelength λg–1.3 μm on the top of a mesa stripe. The ratio t/to of the grown film thickness t on the top of the mesa stripe to the grown film thickness to at a flat portion sufficiently apart from the mesa stripe would be reduced abruptly when the width W of the top of the mesa stripe decreases to a certain extent. Furthermore, for a width W smaller than a certain value, t/to=0 is observed, that is, the layer does not grow on the top of the mesa stripe. The limit value of the width W for which the growth on the top of the mesa stripe can be attained, is determined depending upon the degree of supercooling of the growing solution. The case of two-phase solution technique having a low degree of supercooling, the limit value was about 1 μm, whereas with a supercooling technique having a highh degree of supercooling, the limit value was 0.5 μm or less.

Although it is not clear how the limit value of the top width of the mesa stripe is related too the composition of the InGaAsP mixed crystal that can be grown on the mesa substrate, in the case of two-a phase solution tech- In either case, the orientation of the mesa stripe was <011>, and the formation of the mesa stripe was effected with as HCl system etchant by making use of a mask of photo-resist. The reproducibility of the cross-sectional configuration of the mesa stripe was quite good.

Though the buffer layer of n-InP (Te) is basically unnecessary, it is grown up to an approximately uniform film thickness of about 0.4 μm for the purpose of preventing degradation of characteristics and lowering of a reliability caused by the direct use of the substrate surface. The influence of the existance of the n-InP(Te) buffer layer was observed as a difference by a factor of about 2 with respect to the oscillation threshold of the device.

The current blocking layer was of n-type doped with tellurium (Te). The current blocking layer can be formed of either InGaAsP(λg–1.15 μm) or InP. The finally grown layer was formed of InGaAsP (non-doped) having a wavelength λg–1.3 μm. The InGaAsP layer grown on the (100) oriented surface can grow very evenly if the degree of supercooling of the growing solution is made low, and thereby it can bury the mesa structure of the substrate almost perfectly. The portion of this layer of 50–150 μm in width locating the mesa stripe along its center presents a very good surface flatness. The InGaAsP layer forming the cap layer is relatively thin, having a thickness in the range of several tens of microns is width locating the mesa stripe along its center, and it is relatively thick in the remaining scope.

As the materials of the electrodes, An/Cr/Au-Zn was used on the p-side and Au/Cr/Au-Sn was used on the n-side. For the purpose of improving contact to the electrode on the p-side, the semiconductor wafer is subjected to selective diffusion of Zinc from the p-side surface right above the mesa stripe. The stripe width of the selective diffusion is selected at a sufficiently large value as compared to the width of the top active region. The series resistance value of the electrode was 2-3 ohms or less, and the rising voltage value of the diode presented was obviously dependent upon the composition of the top active region. It is to be noted that a device subjected to entire surface diffusion of Zinc instead of the selective diffusion was also fabricated by way of trial, and no difference was observed from the selectively diffused device with respect to the characteristics such as an oscillation threshold or the like.

Figure 3:
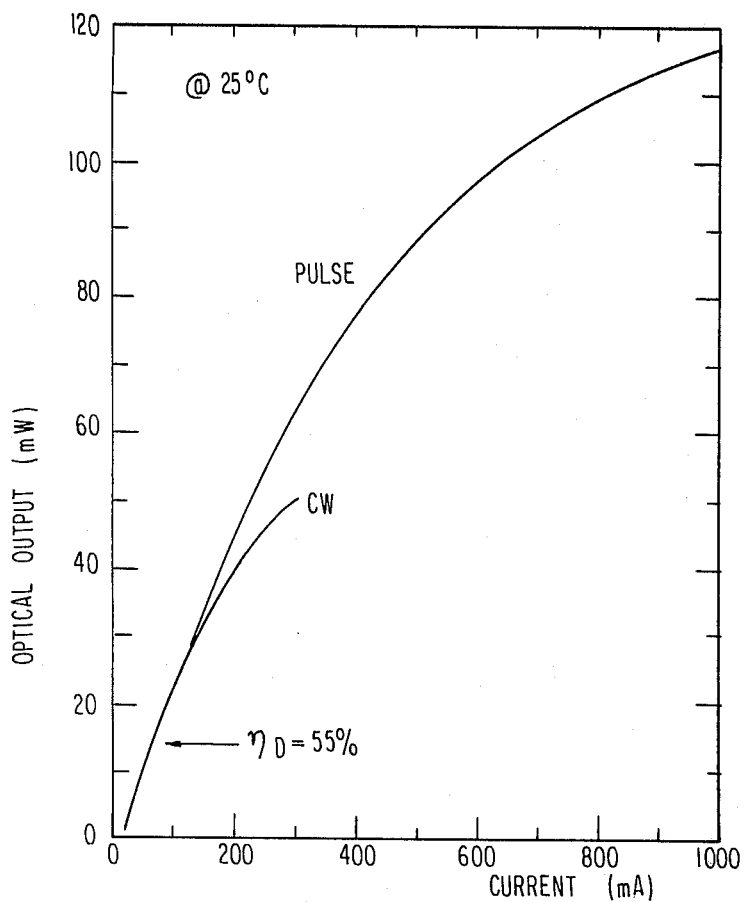
FIG. 3 is a diagram showing optical output versus current characteristics obtained according to a preferred embodiment of the present invention.
Figure 4:
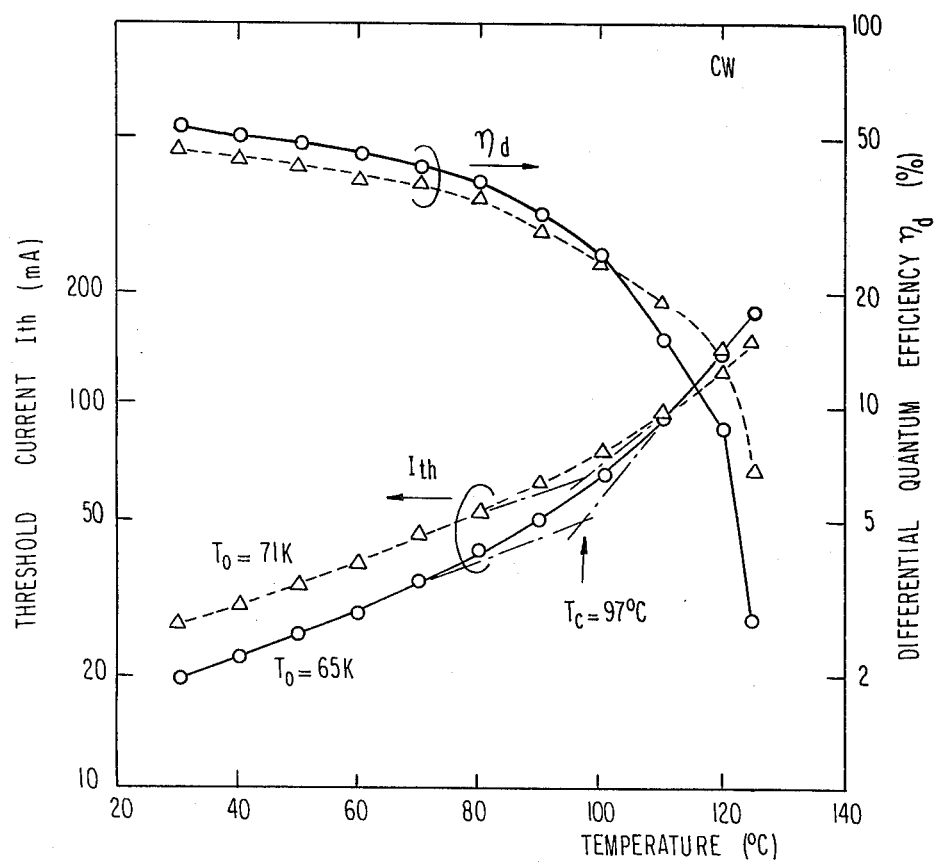
FIG. 4 is a diagram showing oscillation threshold and differential quantum efficiency versus temperature characteristics obtained from two typical samples according to a preferred embodiment of the present invention.
Figure 5:
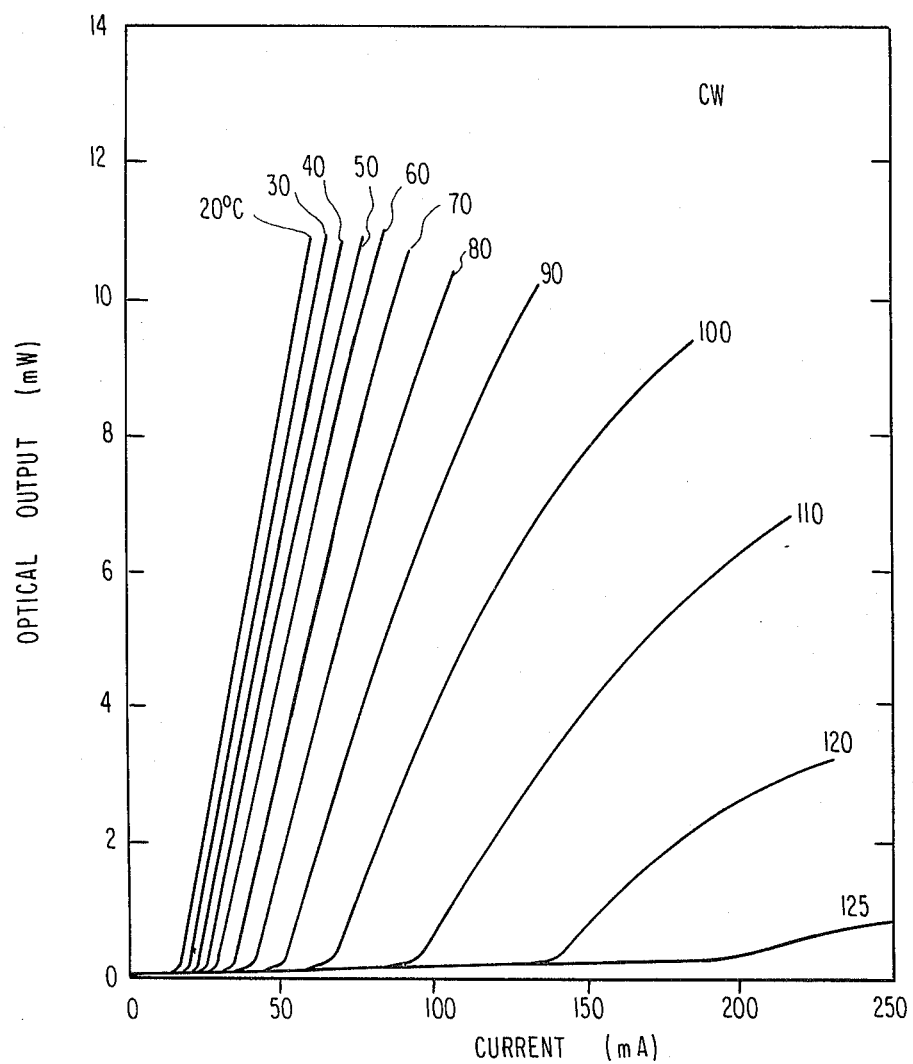
FIG. 5 is a diagram showing optical output versus temperature characteristics obtained according to one preferred embodiment of the present invention.

The operation characteristics of the laser diodes fabricated in the above-described manner will now be described in detail. Firstly, optical output characteristics of the fabricated laser diode for 1.3 $\mu$m band use are shown in FIG. 3. An oscillation threshold upon CW operation at 25° C. of about 20 mA was obtained. A differential quantum efficiency in the neighborhood of an oscillation threshold was about 55%. As a minimum value of an oscillation threshold upon CW operation at 25° C., 18 mA was obtained for 1.3 $\mu$m band use. In a pulse operation, a maximum output power of 120 mW was observed and in a CW operation a maximum output power of 50 mW was observed. secondly, temperature characteristics of two samples of laser diodes for 1.3 $\mu$m band use fabricated by way of trial are shown in FIG. 4. A characteristic temperature To for a temperature variation of an oscillation threshold was about 60 K. to 70 K. A kink temperature Tc was 97° C. It is preferable to have a differencial quantum efficiency higher than 20% at 100° C. FIG. 5 shows current-optical output characteristics taking a temperature of a fabricated laser diode as a variable parameter. As a particular sample, a laser diode that is operable stably with an output of about 10 mW upon CW operation at 80° C., was obtained. It is understood from FIG. 5 that CW operation can be achieved up to a high temperature of 125° C.

Figure 6A:
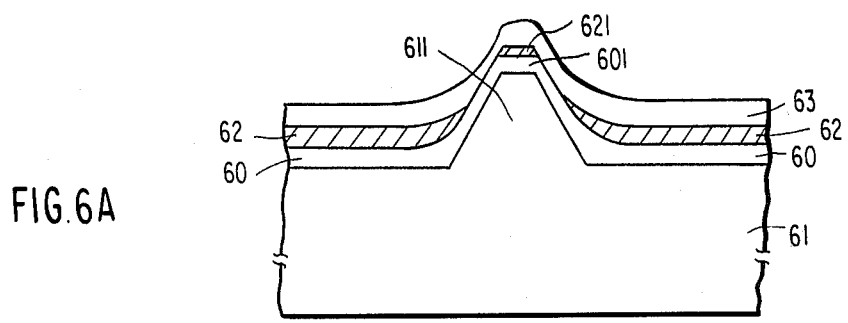
FIGS. 6A to 6C are cross-sectional views showing successive steps in a modified process for fabrication of a laser diode according to the present invention similar to that shown in FIG. 1.
Figure 6B:
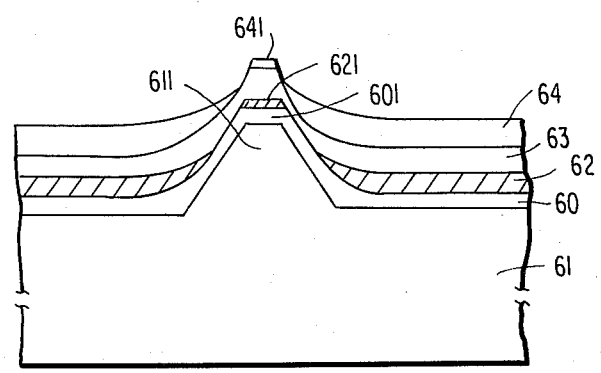
Figure 6C:
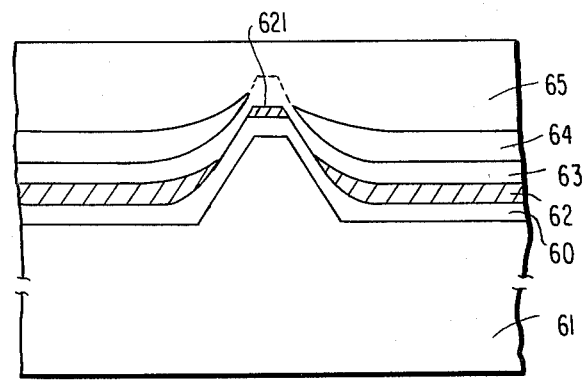

Now a somewhat modified process for fabricating a semiconductor laser having the structure provided with a buffer layer according to the present invention will be explained with reference to FIGS. 6(A) to 6(C).

On an n-InP substrate 61 having a (100) oriented principal surface is formed by etching a stripe-shaped protrusion 611 along the crystalline orientation <011>. When hydrochloric acid was used as an etchant liquor, a clear mesa type cross-section configuration was obtained. Preferably the height of the stripe-shaped protrusion 611 is selected at 3 $\mu$m and the top width thereof at about 2 $\mu$m. If the top width of the protrusion 611 is made broader than 3 $\mu$m, then because of the too broad top active region width, the stability in the transverse mode of the fabricated semiconductor laser is deteriorated. Subsequently, the n-InP substrate is disposed in the conventional slide type liquid phase growing apparatus to commence liquid phase growth. The liquid phase growth was carried out in a hydrogen atmosphere mixed with a small amount of phosphine ($PH_2$). The reason why phosphine is made to flow is to prevent phosphorus (P) from being released from the n-InP substrate 61 at a high temperature. After the substrate was held at a soak temperature of 650° C. for one hour, the temperature was lowered at a cooling speed of 0.8° C./min. When it has reached a growth start temperature of 630° C., the growth commences, and thereby n-InP layers 60 and 601 and active layers 62 and 621 consisting of $In_{0.76}Ga_{0.24}As_{0.55}P_{0.45}$ are grown on the bottom and top of the mesa up to thickness of about 1 $\mu$m and 0.3 $\mu$m, respectively. In the growth of the active layers, the active layer on the top of the mesa, i.e., the top active region 621 ($\sim$2 $\mu$m in width) and the active layer 62 on the opposite sides of the mesa are separately grown (FIG. 6(A)). Subsequently, a p-InP layer 63 is grown up to a thickness of about 1 $\mu$m as a first clad layer, and the current blocking layers 64 and 641 consisting of $n-In_{0.84}Ga_{0.16}As_{0.36}P_{0.64}$ are grown (FIG. 6(B)). In this case also, like the active layers, the current blocking layer 641 ($\sim$0.3 $\mu$m in thickness) on the top of the mesa and the current blocking layer 64 ($\sim$2 $\mu$m in thickness) on the opposite sides of the mesa are grown separately. Thereafter, in order to flaten the surface, a p-InP layer 65 (2-5 $\mu$m in thickness) is grown as a second clad layer (FIG. 6(C)). At this instance, if the degree of supercooling of the growing melt for the p-InP layer 65 is held extremely low, then as the growth on the top of the mesa is suppressed in the beginning of the growth, the current blocking layer 641 on the top of the mesa consisting of $n-In_{0.84}Ga_{0.16}As_{0.55}P_{0.45}$ resolves in the solution. In general, in the case of stacking an InP layer on an InGaAsP layer through a liquid phase growing process, the InGaAsP layer is liable to resolve. Whether the InGaAsP layer resolves or not is believed to be determined depending upon the relation between the resolving speed and the growing speed of the InP to be stacked thereon. It is presumed that in the beginning of the growth since the growth, on the top of the stripe-shaped protrusion is suppressed as described above, the growing speed becomes lower than the resolving speed, and hence the current blocking layer 641 on the mesa resolves. For the purpose of holding the degree of supercooling of the growing solution extremely low, a two-phase solution technique was employed, in which a large amount of InP is mixed in an In solution to keep InP floating in the In solution without being resolved completely in the In solution. At the growing temperature in the above-described embodiment, it was appropriate to mix about 30 mg of InP in 2 g of In. Alternatively, in place of the two-phase melt process a Source-Seed process could be employed, in which until just before growth commences in an In solution, a dummy InP substrate is held in contact with an In solution. When the second p-InP layer 65 has been grown relatively thick (2-5 $\mu$m) to flaten the surface, an epitaxial growth process terminates. Before termination of the epitaxial growth process, similarly to the formation of the cap layer 16 in FIG. 1, an ohmic layer consisting of $p-In_{(1-x)}Ga_xAs_yP_{(1-y)}$ (x, y$\neq$0) could be grown up to a thickness of about 1 $\mu$m in order to reduce the electrode resistance. With regard to the electrodes, a p-electrode made of Au/Zn and an n-electrode made of Au/Sn were formed through vacuum vapor deposition, respectively, on the p-side and on the n-side, and thereafter heat treatment was carried out at 450° C. for about 1 minute. The wafer fabricated through the above-mentioned process is cleaved into pieces having a resonator length of 200-300 $\mu$m to form resonator surfaces, and thereby a laser diode can be obtained.

In the above-described modified process for fabrication, even if a part of the current blocking layer is grown on the top of clad layer in the course of fabrication, it is not objectionable, and so, the modified process has an inherent advantage that the fabrication conditions can be somewhat mitigated.

Figure 7:
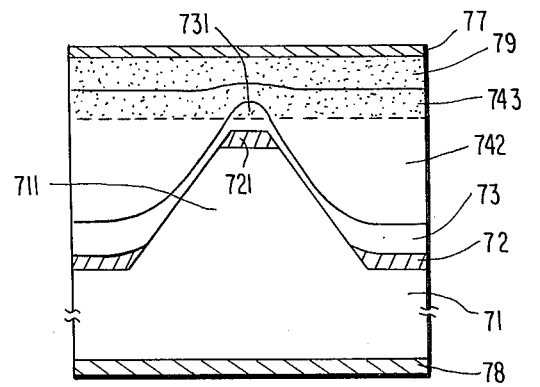
FIG. 7 is a cross-sectional view showing a laser diode according to another preferred embodiment of the present invention.

Such an alternative process for fabrication in which steps in the process are somewhat modified for the purpose of mitigating the fabrication conditions, can be conceived additionally in a different way. Another example of such modified processes will be explained with reference to FIG. 7 in connection to fabrication of a laser diode having substantially the same structure as that shown in FIG. 1. The principal steps of the process for fabrication are nearly identical to those of the above-described embodiments, and so, detailed description thereof will be omitted here.

An InP single crystal substrate 71 having an n-type conductivity and (100) oriented principal surfaces, one face of which is mirror-finished, is prepared, and on the side of the mirror face is formed a stripe-shaped mesa structure 711 along the <011> orientation by chemical etching with hydrochloric acid, making use of a mask of photoresist. The stripe-shaped mesa structure 711 is formed in the direction that is parallel to a cleavage surface of the InP single crystal substrate 71 so that the stripe-shaped mesa structure 711 may have a width of the top of about 2 μm and a height of about 3 μm. Subsequently, four layers are successively formed on the InP single crystal substrate 71 having the stripe-shaped mesa structure 711, that is, an active layer 72 including a top active region 721, a first clad layer 73 having a p-type conductivity, a current blocking layer 742 having an n-type conductivity, and an electrode forming layer 79 are formed through a process of liquid phase epitaxial growth. The active layer 72 has a composition of $In_{0.74}Ga_{0.26}As_{0.56}P_{0.44}$ corresponding to an oscillation wavelength of 1.3 μm, and a thickness of growth thereof is about 0.3 μm in the top active region 721. The first clad layer 73 consists of cadmium (Cd)-doped InP, and a thickness of growth thereof is smaller than the height of the stripe-shaped mesa structure 711 and equal to 1-2 μm. The current blocking layer 742 consists of tin (Sn)-doped InP, and it has a thickness of growth of about 4 μm which perfectly buries the stripe-shaped mesa structure 711. The electrode forming layer 79 has a composition of non-doped $In_{0.74}Ga_{0.26}As_{0.56}P_{0.44}$, and a thickness of growth thereof is about 0.5 μm. Although some variations are observed depending upon differences in the condition of liquid phase epitaxial growth, normally the growth on the sloped portions of the stripe-shaped mesa structure 711 is suppressed, and crystal growth is effected on the top of the stripe-shaped mesa structure 711 and on the flat portion of the substrate contiguous to the bottom of the mesa structure. As the crystal growth proceeds, the width of the top flat portion of the strip-shaped mesa structure 711 is narrowed, hence the growth on the top flat portion tends to be suppressed, and as a result, a wafer having the cross-sectional structure shown in FIG. 7 can be obtained. After the step of liquid phase epitaxial growth, thermal diffusion of Zinc is effected from the surface of the electrode forming layer 79 to form an inverted conductivity type layer 743 having a depth reaching a mesa top clad region 731 of the first clad layer 73. Finally, a p-side electrode 77 made of Au-Zn alloy is formed by vacuum vapor deposition and the bottom surface of the InP single crystal substrate 71 is polished to form a wafer of 70-80 μm in thickness. Thereafter, an n-side electrode 78 made of Au-Sn alloy is formed again by vacuum vapor deposition, and the wafer is cleaved into pieces having a length of a stripe-shaped mesa structure 711, that is, a resonator length of 200-300 μm to cut out BH-LDs.

In the BH-LD fabricated through the above-described modified process, owing to the existence of the inverted conductivity type layer 743, a narrow current path, corresponding to the width of the top active region 721, can be naturally formed in the mesa top clad region 731 near to the top active region 721.

It is to be noted that while the thickness of growth of the respective semiconductor layers referred to above in connection with the modified fabrication process, were given not in a limiting sense. However, in order to form an effective confined current path by uniform introduction of an impurity from a wafer surface without necessitating a diffusion mask, it is at least important that the upper boundary of the mesa top clad region 731 should not be located any higher than the upper boundary of the top active region 721. Moreover, so that an ineffective current is not increased by current expansion in the lateral direction in the mesa top clad region 731, it is desirable not to thicken, to an unnecessary extent, the thickness of the first clad layer 73 along the sloped portions of the stripe-shaped mesa structure 711. With regard to the kinds of the impurities to be doped into the respective semiconductor layers, they are not limited to particular ones so long as they can realize the designated conductivity types. While the electrode forming layer 79 was made of non-doped $In_{0.74}Ga_{0.26}As_{0.56}P_{0.44}$ in the above-described embodiment, it could be made of a Zinc-doped composition and the inverted conductivity type layer 743 could be formed by impurity diffusion during epitaxial growth. With regard to the composition of the top active region 721, it is not limited to that indicated in the above-described embodiment, but instead it could have, for instance, a composite layer structure.

With respect to a BH-LD having current confining means according to the present invention which can be fabricated through one step liquid phase crystal growth, the structure, processes for fabrication and characteristics of fabricated devices have been described above. In the laser diode according to the present invention, by additionally providing current confining means in the heretofore known MSB-LD structure, an oscillation threshold was lowered to about 1/5 of that of the prior art laser diode. Moreover, it is possible to achieve formation of current confining means through a single liquid phase growth in the process of forming a buried structure of a top active region, by making use of the relation between a degree of supercooling of a growing melt and a crystal growing speed on the top of a mesa stripe. This was discovered as a result of investigations on selective crystal growth depending upon an orientation of a mesa stripe.

In the laser diode according to the present invention, the burying structure for the top active region and the current confining means are perfectly continuous to each other both with respect to the semiconductor structure and with respect to the LPE process. Therefore, the phenomena which often come into question in the case of a BH-LD for which the LPE process for burying is carried out separately, for instance, the phenomenon of greatly increased current leakage is due to formation of a high-resistance layer above the top active region, is hardly observed. The laser diode structure according to the present invention has inherent advantages. Despite a structure which seems, at a glance, to have a large current leakage through the p-InP clad layer, in practice the current leakage is suppressed to a small value by the effect of the expanded resistance of the p-InP clad layer. Furthermore, owing to the existence of the p-Inp clad layer covering the top active region, the requirement for the position of the current blocking layer can be greatly mitigated.

What is claimed is:

1. A buried heterostructure laser diode comprising a semiconductor crystal having a pair of principal surfaces and a pair of reflective end surfaces constituting an optical resonator, and a pair of electrodes, said semiconductor crystal including a base semiconductor region having a mesa portion and having a first conductivity type, said mesa portion being elongated between said pair of reflective end surfaces in a stripe geometry, said semiconductor crystal further including a first semiconductor layer provided on a top surface of said mesa portion and having a band gap smaller than that of said base region and extending between said pair of reflective end surfaces in a stripe geometry, a second semiconductor layer having a second conductivity type and a band gap larger than that of said first layer and having a first region covering a top surface of said first layer, a second region covering a side surface of each of said first layer and said mesa portion, and a third region covering the other side surfaces of said first layer and said mesa portion, a pair of third semiconductor layers provided respectively on said second and third regions of said second layer and having said first conductivity type and a band gap larger than that of said first layer, and a fourth semiconductor layer commonly provided on the top surfaces of said second layer and said third layers and having said second conductivity type and a band gap larger than that of said first layer, said electrodes being provided on said principal surfaces.

2. A buried heterostruture laser diode comprising a semiconductor crystal having a pair of principal surfaces and a pair of reflective end surfaces constituting an optical resonator, and a pair of electrodes provided on said principal surfaces, said semiconductor crystal including a base semiconductor region having a mesa portion and having a first conductivity type, said mesa portion being elongated between said pair of reflective end surfaces in a stripe geometry, said semiconductor crystal further including a first semiconductor layer provided on said base semiconductor region except for a pair of side surfaces of said mesa portion and having a band gap smaller than that of said base region and extending between said pair of reflective end surfaces, a second semiconductor layer commonly provided on said first layer and said side surfaces of said mesa portion and having a second conductivity type and a band gap larger than that of said first layer, said second semiconductor layer having a top region covering a top surface of said mesa portion, a third semiconductor layer provided on said second layer except for said top region and having said first conductivity type and a band gap larger than that of said first layer, and a fourth semiconductor layer commonly provided on said top region of said second layer and said third layer and having said second conductivity type and a band gap larger than that of said first layer.

3. A buried heterostructure laser diode as claimed in claim 2, in which said base semiconductor region consists of InP having a crystalline surface of (100), and said mesa portion extends in a crystalline direction of $<011>$, said first layer consisting of InGaAsP, and said second, third and fourth layers consisting of either InP or InGaAsP.

4. A buried heterostructure laser diode as claimed in claim 3, in which said top surface of said mesa portion has a width of 0.5 $\mu$m to 3 $\mu$m and a height of 3 $\mu$m to 4 $\mu$m.

5. A buried heterostructure laser diode as claimed in claim 4, which each of said first, second and third layers has a thickness smaller than the height of said mesa portion.

6. A buried heterostructure laser diode as claimed in claim 2, in which said base semiconductor region includes a semiconductor substrate and a buffer layer provided on said semiconductor substrate.

7. A buried heterostructure laser diode comprising a semiconductor crystal having a pair of principal surfaces and a pair of reflective end surfaces constituting an optical resonator, and a pair of electrodes provided on said principal surfaces, said semicoductor crystal including an InP substrate having a (100) oriented or nearly (100) oriented surface and having a first conductivity type, said InP substrate further having a mesa portion elongated along a $<011>$ direction between said pair of reflective end surfaces in a stripe geometry, said semiconductor crystal further including an InGaAsP active layer provided on said InP substrate except for a pair of said surfaces of said mesa portion and extending between said pair of reflective end surfaces, an InP or InGaAsP first clad layer commonly provided on said active layer and said side surfaces of said mesa portion and having a second conductivity type, InP or InGaAsP current blocking layers separately provided on said first clad layer except for a region of said first clad layer covering a top surface of said mesa portion and having said first conductivity type, and an InP or InGaAsP second clad layer commonly provided on said top region of said first clad layer and said current blocking layer and having said second conductivity type.

8. A buried heterostructure laser diode comprising a semiconductor crystal having a pair of principal surfaces and a pair of reflective end surfaces constituting an optical resonator, and a pair of electrodes provided on said principal surfaces, said semiconductor crystal including a base semiconductor region having a mesa portion protruding from a pair of flat portions and having a first conductivity type, said mesa portion being elongated between said pair of reflective end surfaces in a stripe geometry, said semiconductor crystal further including first semiconductor layers selectively provided on a top surface of said mesa portion and on said pair of flat portions and having a band gap smaller than that of said base region, a second semiconductor layer commonly provided on said first layers and on a pair of side surfaces of said mesa portion and having a second conductivity type and a band gap larger than that of said first layers, a pair of third semiconductor layers selectively provided on a pair of surfaces of said second layer opposite said side surfaces of said mesa portion and flat portions of said base semiconductor region, respectively, and having said first conductivity type and a band gap larger than that of said first layers, and a fourth semiconductor layer commonly provided on said second layer and said third layers and having said second conductivity type and band gap larger than that of said first layers, each of said first, second and third layers having a thickness at said flat portions smaller than a height of said mesa portion.

9. A buried heterostructure laser diode as claimed in claim 8, in which said semiconductor crystal further includes a fifth semiconductor layer provided between said fourth layer and one of said electrodes.

10. A buried heterostructure laser diose as claimed in claim 9, in which said fifth layer has said first conductivity type, except for a stripe region of said fifth layer opposite said top surface of said mesa portion having said second conductivity type and extending from said one electrode to said fourth layer.

11. A buried heterostructure laser diode comprising a semiconductor crystal having a pair of principal surfaces and a pair of reflective end surfaces constituting an optical resonator, and a pair of electrodes, said semiconductor crystal including a base semiconductor region having a mesa portion and having a first conductivity type, said mesa portion being elongated between said pair of reflective end surfaces in a stripe geometry, said semiconductor crystal further including a first semiconductor layer provided on a top surface of said mesa portion and having a band gap smaller than that of said base region and extending between said pair of reflective end surfaces in a stripe geometry, a second semiconductor layer commonly provided on said first layer and on portions of said base semiconductor region uncovered by said first layer thereby covering side surfaces of said first layer and side surfaces of said mesa portion and having a second conductivity type and a band gap larger than that of said first layer, said second layer having a protruding portion corresponding to said mesa portion, a third semiconductor layer provided on said second layer and having said first conductivity type and a band gap larger than that of said first layer, and a fourth semiconductor layer provided on said third layer and having said first conductivity type and a band gap larger than that of said first layer, said electrodes being provided on said fourth layer and on the bottom of said base semiconductor region, said fourth layer and a part of said third layer being converted into said second conductivity type, the converted portion of said third layer extending from said fourth layer to said protruding portion of said second layer.

12. A buried heterostructure laser diode comprising a semiconductor crystal having a pair of principal surfaces and a pair of reflective end surfaces constituting an optical resonator, and a pair of electrodes, said semiconductor crystal including a base semiconductor region having a mesa portion and having a first conductivity type, said mesa portion being elongated between said pair of reflective end surfaces in a stripe geometry, said semiconductor crystal further including a first semiconductor layer provided on a top surface of said mesa portion and having a band gap smaller than that of said base region and extending between said pair of reflective end surfaces in a stripe geometry, a second semiconductor layer commonly provided on said first layer and on portions of said base semiconductor region uncovered by said first layer thereby covering side surfaces of said first layer and side surfaces of said mesa portion and having a second conductivity type and a band gap larger than that of said first layer, said second layer having a protruding portion corresponding to said mesa portion, a third semiconductor layer provided on said second layer and having a band gap larger than that of said first layer, said third semiconductor layer having a first portion of said first conductivity type and a second portion overlying said first portion and having said second conductivity type, said second portion contacting said protruding portion of said second layer, and a fourth semiconductor layer provided on said third layer and having said second conductivity type and a band gap larger than that of said first layer, said electrodes being provided on said fourth layer and on the bottom of said base semiconductor region.

* * * * *

UNITED STATES PATENT AND TRADEMARK OFFICE
CERTIFICATE OF CORRECTION

PATENT NO. : 4,429,397
DATED : January 31, 1984
INVENTOR(S) : MITSUNORI SUGIMOTO and HIDENORI NOMURA It is certified that error appears in the above-identified patent and that said Letters Patent is hereby corrected as shown below:

Column 1, line 24, after "steps", insert --.--;
         line 50, before "means", change "inning" to --ing--;
         line 59, after "the", change "propsed" to --proposed--;
         line 61, after "active", delete the ",".
Column 2, line 52, after "invention", change the "." to a --,--.
Column 3, line 48, before "of", change "forrmed" to --formed--;
         line 66, after "layer", change "24" to --14--.
Column 4, line 12, after "junction", insert a --,--;
         line 34, after "be", change "discribed" to --described--.
Column 5, line 60, change "case", to --In the case of--;
         line 63, before "degree", change "highh" to --high--;
         line 66, after "related", change "too" to --to--.
Column 7, line 30, before "temperature", change "secondly," to --Secondly--;
         line 36, after "a", change "differencial" to --differential--.

UNITED STATES PATENT AND TRADEMARK OFFICE
CERTIFICATE OF CORRECTION

PATENT NO. : 4,429,397

DATED : January 31, 1984

INVENTOR(S) : MITSUNORI SUGIMOTO AND HIDENORI NOMURA

It is certified that error appears in the above-identified patent and that said Letters Patent is hereby corrected as shown below:

Column 8, line 18, after "to", change "flaten" to --flatten--;
line 33, after "growth" (first occurrence), insert a --,--;
line 33, after "growth" (second occurrence), delete the ",";
line 50, after "to", change "flaten" to --flatten--;
line 54, after "IN", insert a --(-- in the subscript.
Column 10, line 10, after "layers ", insert a --,--.

IN THE CLAIMS:

Column 12, line 8, before "which", insert --in--.
Column 13, line 5, after "laser", change "diose" to --diode--.

Signed and Sealed this

*Thirty-first* Day of *July 1984*

[SEAL]

*Attest:*

GERALD J. MOSSINGHOFF

*Attesting Officer*  *Commissioner of Patents and Trademarks*

UNITED STATES PATENT AND TRADEMARK OFFICE
CERTIFICATE OF CORRECTION

PATENT NO. : 4,429,397
DATED : January 31, 1984
INVENTOR(S) : MITSUNORI SUGIMOTO and HIDENORI NOMURA It is certified that error appears in the above-identified patent and that said Letters Patent is hereby corrected as shown below:

```
     Column 1, line 24, after "steps", insert --.--;
              line 50, before "means", change "inning" to --ing--;
              line 59, after "the", change "propsed" to --proposed--;
              line 61, after "active", delete the ",".
     Column 2, line 52, after "invention", change the "." to a --,--.
     Column 3, line 48, before "of", change "forrmed" to --formed--;
              line 66, after "layer", change "24" to --14--.
     Column 4, line 12, after "junction", insert a --,--;
              line 34, after "be", change "discribed" to --described--.
     Column 5, line 60, change "The" to --In the--.
              line 63, before "degree", change "highh" to --high--;
              line 66, after "related", change "too" to --to--.
     Column 7, line 30, before "temperature", change "secondly," to
--Secondly--;
              line 36, after "a", change "differencial" to
--differential--.
```

UNITED STATES PATENT AND TRADEMARK OFFICE
CERTIFICATE OF CORRECTION

PATENT NO. : 4,429,397

DATED : January 31, 1984

INVENTOR(S) : MITSUNORI SUGIMOTO AND HIDENORI NOMURA

It is certified that error appears in the above-identified patent and that said Letters Patent is hereby corrected as shown below:

Column 8, line 18, after "to", change "flaten" to --flatten--;
line 33, after "growth" (first occurrence), insert a --,--;
line 33, after "growth" (second occurrence), delete the ",";
line 50, after "to", change "flaten" to --flatten--;
line 54, after "IN", insert a --(-- in the subscript.
Column 10, line 10, after "layers ", insert a --,--.

IN THE CLAIMS:

Column 12, line 8, before "which", insert --in--.
Column 13, line 5, after "laser", change "diose" to --diode--.

This certificate supersedes certificate of correction issued July 31, 1984.

Signed and Sealed this

Twenty-second Day of October 1985

[SEAL]

Attest:

DONALD J. QUIGG

Attesting Officer

Commissioner of Patents and Trademarks—Designate